(12) United States Patent
Lin et al.

(10) Patent No.: US 8,456,853 B2
(45) Date of Patent: Jun. 4, 2013

(54) ELECTRONIC DEVICE CHASSIS

(75) Inventors: Chieh-Hsiang Lin, Tu-Cheng (TW);
Wen-Tang Peng, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 150 days.

(21) Appl. No.: 12/975,295

(22) Filed: Dec. 21, 2010

(65) Prior Publication Data

US 2012/0153784 A1 Jun. 21, 2012

(30) Foreign Application Priority Data

Dec. 17, 2010 (TW) .................................. 99144643

(51) Int. Cl.
*H05K 5/00* (2006.01)

(52) U.S. Cl.
USPC .......................................................... 361/759

(58) Field of Classification Search
USPC ........................................ 361/759; 312/223.1
See application file for complete search history.

(56) References Cited

U.S. PATENT DOCUMENTS

| | | | |
|---|---|---|---|
| 6,017,226 A * | 1/2000 | Jeffries et al. .................. | 439/92 |
| 6,071,131 A * | 6/2000 | Pliml, Jr. ......................... | 439/95 |
| 6,259,032 B1 * | 7/2001 | Fernandez ................ | 174/138 E |
| 6,377,445 B1 * | 4/2002 | Davis et al. .................... | 361/752 |
| 6,424,538 B1 * | 7/2002 | Paquin ........................... | 361/752 |
| 6,695,629 B1 * | 2/2004 | Mayer ............................ | 439/92 |
| 6,799,980 B2 * | 10/2004 | Bloomfield et al. ............ | 439/92 |
| 7,028,389 B2 * | 4/2006 | Chang ............................. | 29/739 |
| 7,364,442 B2 * | 4/2008 | Bang et al. ..................... | 439/92 |
| 7,385,830 B2 * | 6/2008 | Liu et al. ........................ | 361/810 |
| 7,430,129 B1 * | 9/2008 | Peng .............................. | 361/807 |
| 7,819,674 B2 * | 10/2010 | Miyoshi et al. ................. | 439/92 |
| 7,819,693 B2 * | 10/2010 | Polnyi ........................... | 439/573 |
| 2009/0181563 A1 * | 7/2009 | Lin et al. ........................ | 439/92 |
| 2010/0254078 A1 * | 10/2010 | Zheng et al. ............. | 361/679.02 |
| 2010/0265670 A1 * | 10/2010 | Chan et al. .................... | 361/748 |

* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

A chassis includes a board defining a number of openings, and a number of fixing members detachably mounted on the board. Each fixing member includes a fastener and a holding piece. The fastener includes a blocking portion and a post extending from the blocking portion. The post defines a slot adjacent to the blocking portion. The holding piece fits about the fastener in the slot. The fastener extends through a corresponding opening of the board. An outer side of the board blocks the blocking portion, and an inner side of the board blocks the holding piece.

2 Claims, 4 Drawing Sheets

ELECTRONIC DEVICE CHASSIS

BACKGROUND

1. Technical Field

The present disclosure relates to a chassis of an electronic device.

2. Description of Related Art

A circuit board is fixed to a computer chassis through a plurality of supporting posts. When there is a need to fix another circuit board having a different size, the supporting posts should be replaced with other supporting posts. However, in most cases, the supporting posts are integrally formed with the chassis, which can be difficult and inconvenient to replace.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
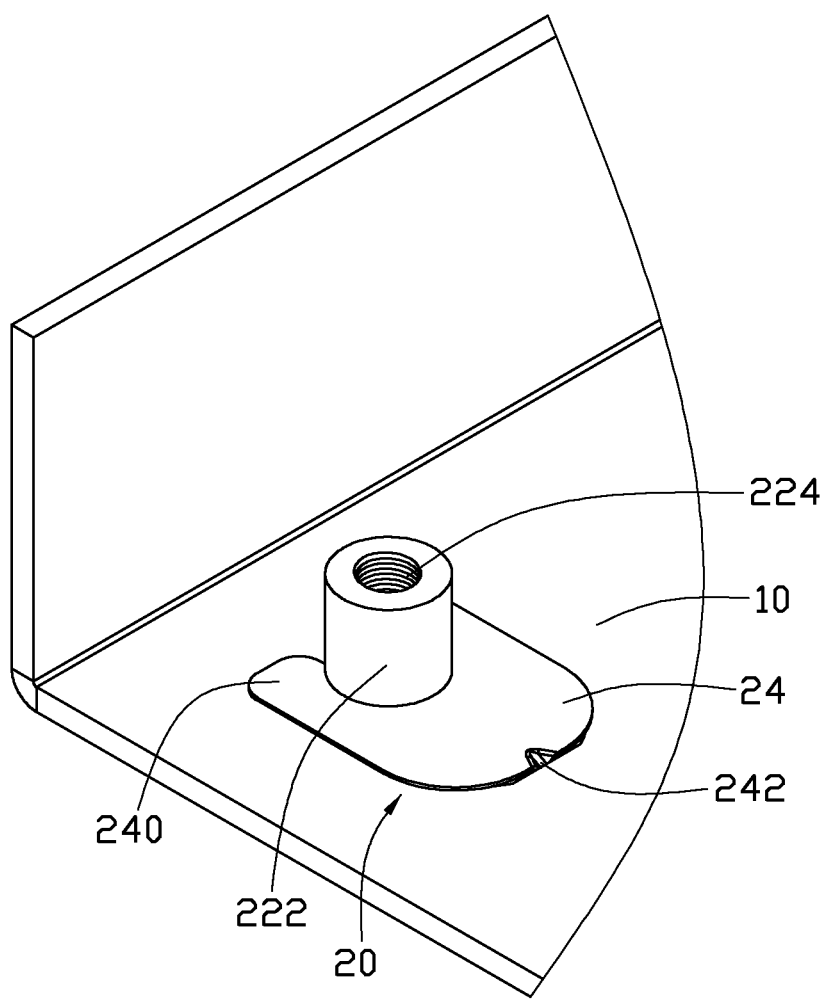
FIG. 1 is a partial assembled, isometric view of an exemplary embodiment of a chassis of an electronic device.
Figure 2:
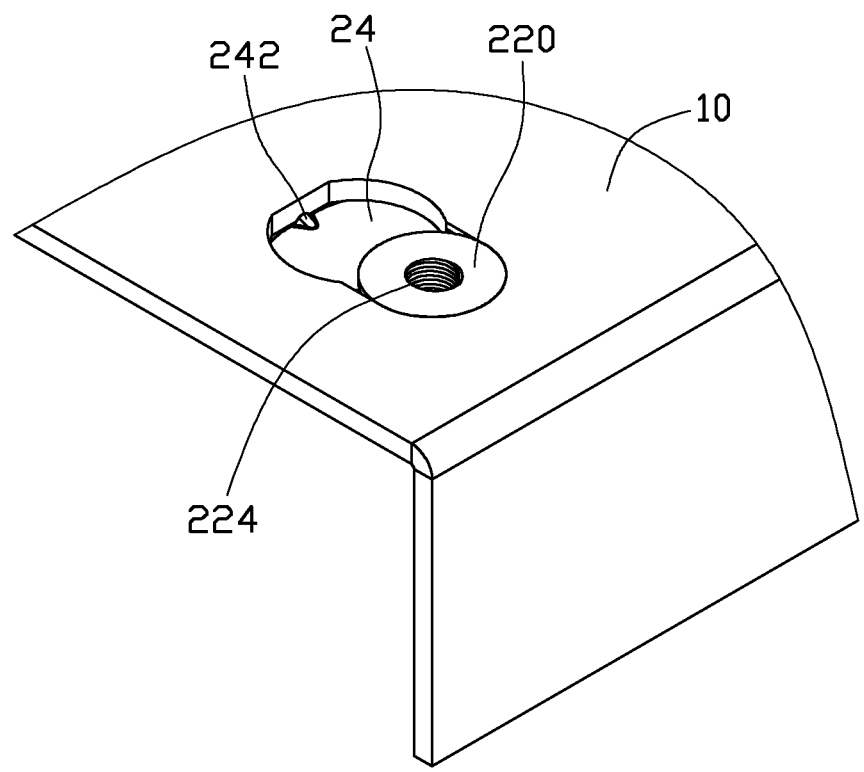
FIG. 2 is an inverted view of FIG. 1.
Figure 3:
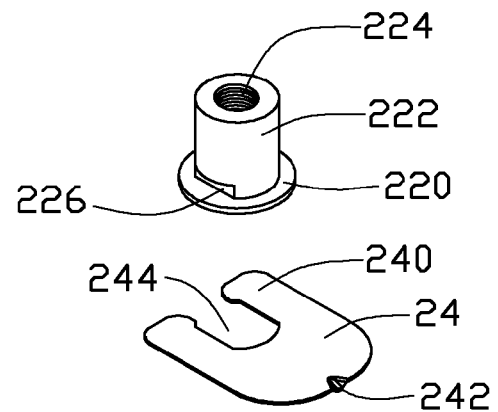
FIG. 3 is an exploded, isometric view of the chassis of FIG. 1.
Figure 3:
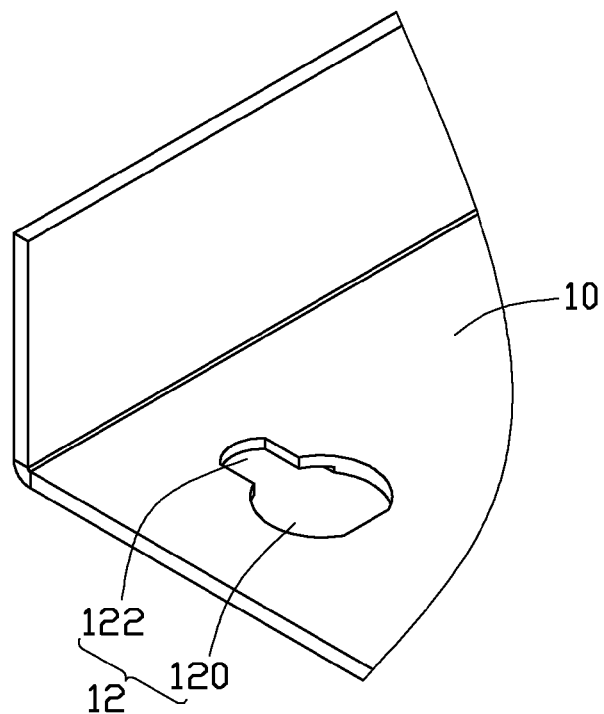
Figure 4:
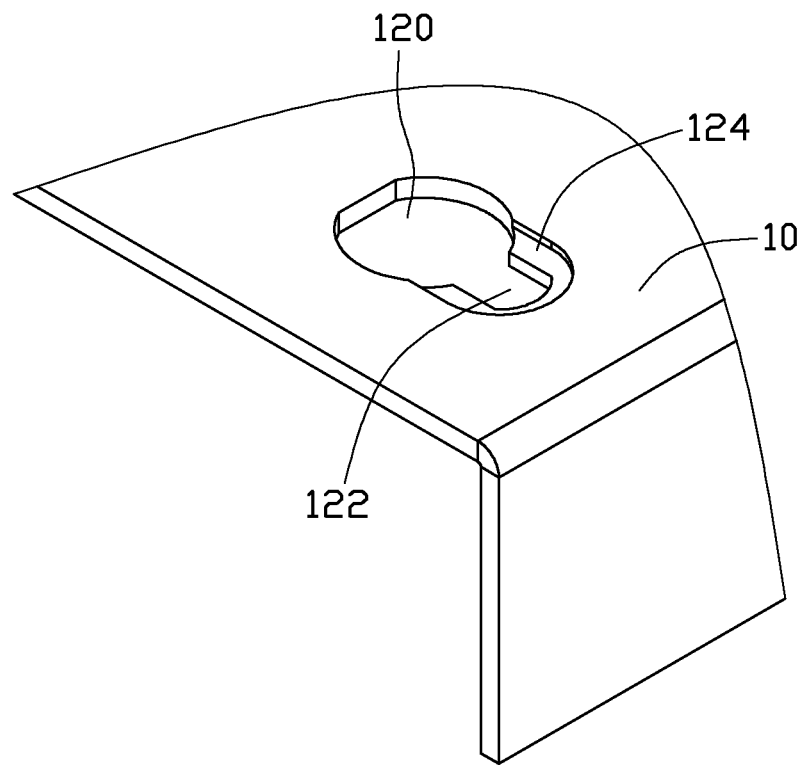
FIG. 4 an inverted view of FIG. 3.
Figure 4:
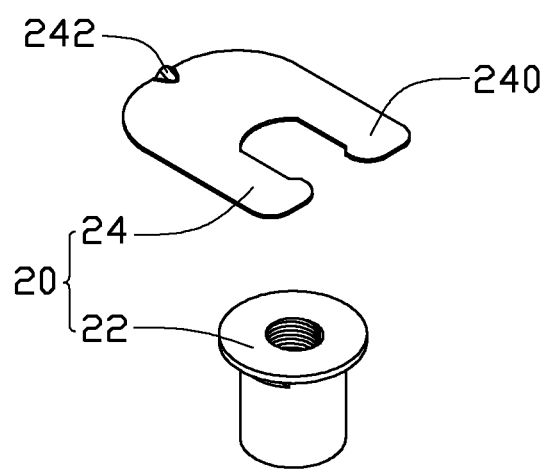

Referring to FIG. 1 to FIG. 4, an exemplary embodiment of a chassis of an electronic device, such as a computer, includes a board 10 and a plurality of fixing members 20 detachably mounted on the board 10.

A plurality of openings 12 is defined in the board 10. Each opening 12 includes a bigger first through hole 120 and a smaller second through hole 122 communicating with the first through hole 120. A substantially U-shaped flange portion 124 extends from an inner side bounding the second through hole 122, and is adjacent to an outer side of the board 10.

Each fixing member 20 includes a fastener 22 and a holding piece 24. The fastener 22 is substantially T-shaped, and includes a blocking portion 220 and a post 222 extending from a center of the blocking portion 220. The post 222 axially defines a screw hole 224 extending through the post 222 and the blocking portion 220 and defines two separate and straight slots 226 in two opposite sides of a circumference of the post 222, adjacent to the blocking portion 220. The holding piece 24 is substantially U-shaped, and includes two opposite clips 240, with distal ends of the clips 240 extending toward each other. A receiving slot 244 is defined between the clips 240. A substantially wedge-shaped latch 242 extends down from a center of the holding piece 24 opposite to the clips 240.

In assembly, the clips 240 of the holding piece 24 are deformed to move away from each other, thus the holding piece 24 non-rotatably fits about the post 222 of the fastener 22 in the slots 226. The clips 240 clamp the post 222 in the slots 226, and the distal ends of the clips 240 resist against the post 222. A bottom of the receiving slot 244 contactingly resists a side of the post 222 facing the corresponding first through hole 120, to prevent the post 222 from sliding back in the first through hole 120. The blocking portion 220 of the fastener 22 extends through the first through hole 120 from an inner side of the board 10. The holding piece 24 is attached to the inner side of the board 10. The fastener 22 is moved to the second through hole 122 from the first through hole 120. Therefore, the blocking portion 220 of the fastener 22 is received in and blocked by the flange portion 124, and the latch 242 is blocked by the inner side bounding the first through hole 120 away from the second through hole 122, to fix the fixing member 20 to the board 10.

When the fastener 22 needs to be replaced, the latch 242 is disengaged from the inner side bounding the first through hole 120. The fastener 22 is moved to the first through hole 120; thereby the blocking portion 220 of the fastener 22 can be easily removed from the first through hole 120. The holding piece 24 is moved from the fastener 22 by deforming the clips 240 away from each other.

In other embodiments, in assembly, the post 222 of the fastener 22 extends through the first through hole 120 from the outer side of the board, until the slots 226 extend out of the first through hole 20. The fastener 22 is moved to the second through hole 122 from the first through hole 120. The blocking portion 1220 of the fastener 22 is blocked by the flange portion 124 of the second through hole 122. The holding piece 24 fits about the post 222 in the slots 226. The latch 242 is engaged with the inner side bounding the first through hole 120.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A chassis of an electronic device, comprising:
   a board defining a plurality of openings, each opening comprising a bigger first through hole and a smaller second through hole communicating with the first through hole; and
   a plurality of fixing members, each fixing member comprising a fastener and a U-shaped holding piece, the fastener comprising a blocking portion and a post extending from the blocking portion, the post defining two separate slots in two opposite sides of a circumference of the post adjacent to the blocking portion, such that the holding piece non-rotatably fits about the post in the slots;
   wherein each fastener extends through a corresponding one of the first through holes to be shifted to and received in the corresponding second through hole, the blocking portion is blocked by an outer side of the board, and the holding piece is blocked by an inner side of the board; and
   wherein the holding piece comprises two opposite clips, to clamp the post of the fastener, a latch extends down from the holding piece opposite to the clips to engage in the first through hole and be blocked by an inner side of the first through hole facing the second through hole, thereby preventing the holding piece from disengaging from the slots.

2. The chassis of claim 1, wherein a flange portion extends from a side bounding the second through hole, and is adjacent to an outer side of the board, the blocking portion of the fastener is blocked by the flange portion.

* * * * *